(12) United States Patent
Zhang et al.

(10) Patent No.: US 8,232,558 B2
(45) Date of Patent: Jul. 31, 2012

(54) JUNCTION BARRIER SCHOTTKY DIODES WITH CURRENT SURGE CAPABILITY

(75) Inventors: Qingchun Zhang, Cary, NC (US); Sei-Hyung Ryu, Cary, NC (US)

(73) Assignee: Cree, Inc., Durham, NC (US)

( * ) Notice: Subject to any disclaimer, the term of this patent is extended or adjusted under 35 U.S.C. 154(b) by 383 days.

(21) Appl. No.: 12/124,341

(22) Filed: May 21, 2008

(65) Prior Publication Data

US 2009/0289262 A1    Nov. 26, 2009

(51) Int. Cl.
   *H01L 29/24* (2006.01)
(52) U.S. Cl. ... 257/77; 257/471; 257/484; 257/E29.104; 257/E29.338
(58) Field of Classification Search ............ 257/77, 257/471, 484; 438/523
   See application file for complete search history.

(56) References Cited

U.S. PATENT DOCUMENTS

| | | | | |
|---|---|---|---|---|
| 6,104,043 | A | 8/2000 | Hermansson et al. | 257/77 |
| 6,524,900 | B2 | 2/2003 | Dahlqvist et al. | 438/167 |
| 6,861,723 | B2 * | 3/2005 | Willmeroth | 257/471 |
| 2003/0057482 | A1 | 3/2003 | Harada | |
| 2006/0255423 | A1 * | 11/2006 | Ryu et al. | 257/485 |
| 2008/0029838 | A1 | 2/2008 | Zhang et al. | 257/475 |
| 2008/0251793 | A1 * | 10/2008 | Mazzola et al. | 257/77 |
| 2008/0277669 | A1 * | 11/2008 | Okuno et al. | 257/77 |

FOREIGN PATENT DOCUMENTS

| | | |
|---|---|---|
| JP | 2000-252478 A | 9/2000 |
| JP | 2001-085704 A | 3/2001 |
| JP | 2002-314099 | * 10/2002 |

OTHER PUBLICATIONS

International Search Report and Written Opinion (16 pages) corresponding to International Application No. PCT/US2009/003089; Mailing Date: Aug. 20, 2009.
Fisher, C.A. et al., "The performance of high-voltage field relieved Schottky barrier diodes", IEE Proceedings, vol. 132:6, Pt. I, pp. 257-260 (Dec. 1985).
International Preliminary Report on Patentability for corresponding application PCT/US2009/003089 dated Nov. 23, 2010.
European Communication Corresponding to European Application No. 07 112 298.0; Dated: Jan. 16, 2012; 7 pages.
European Communication Corresponding to European Application No. 09750952.5-1235; Date of Notification: Mar. 8, 2012; 5 pages.

* cited by examiner

*Primary Examiner* — A. Sefer
(74) *Attorney, Agent, or Firm* — Myers Bigel Sibley & Sajovec

(57) ABSTRACT

An electronic device includes a silicon carbide drift region having a first conductivity type, a Schottky contact on the drift region, and a plurality of junction barrier Schottky (JBS) regions at a surface of the drift region adjacent the Schottky contact. The JBS regions have a second conductivity type opposite the first conductivity type and have a first spacing between adjacent ones of the JBS regions. The device further includes a plurality of surge protection subregions having the second conductivity type. Each of the surge protection subregions has a second spacing between adjacent ones of the surge protection subregions that is less than the first spacing.

20 Claims, 7 Drawing Sheets

JUNCTION BARRIER SCHOTTKY DIODES WITH CURRENT SURGE CAPABILITY

FIELD OF THE INVENTION

The present invention relates to semiconductor devices and the fabrication of semiconductor devices and more particularly, to Junction Barrier Schottky (JBS) diodes, and the fabrication of such diodes.

BACKGROUND

High voltage silicon carbide (SiC) Schottky diodes, which may have voltage blocking ratings between, for example, about 600V and about 2.5 kV, are expected to compete with silicon PIN diodes having similar voltage ratings. Such diodes may handle as much as about 100 amps or more of forward current, depending on their active area design. High voltage Schottky diodes have a number of important applications, particularly in the field of power conditioning, distribution and control.

An important characteristic of a SiC Schottky diode in such applications is its switching speed. Silicon-based PIN devices typically exhibit relatively poor switching speeds. A silicon PIN diode may have a maximum switching speed of approximately 20 kHz, depending on its voltage rating. In contrast, silicon carbide-based Schottky devices are theoretically capable of much higher switching speeds, for example, in excess of about 100 times better than silicon. In addition, silicon carbide devices may be capable of handling a higher current density than silicon devices.

A conventional SiC Schottky diode structure has an n-type SiC substrate on which an n− epitaxial layer, which functions as a drift region, is formed. The device typically includes a Schottky contact formed directly on the n-layer. A junction termination region, such as a guard ring and/or p-type JTE (junction termination extension) region, is typically formed to surround the Schottky junction active region. The purpose of junction termination region is to reduce or prevent electric field crowding at the edges of the Schottky junction, and to reduce or prevent the depletion region from interacting with the surface of the device. Surface effects may cause the depletion region to spread unevenly, which may adversely affect the breakdown voltage of the device. Other termination techniques include field plates and floating field rings that may be more strongly influenced by surface effects. A channel stop region may also be formed by implantation of n-type dopants in order to prevent the depletion region from extending to the edge of the device.

Regardless of the type of termination used, the Schottky diode will typically fail if a large enough reverse voltage is applied to the junction. Such failures are generally catastrophic, and may damage or destroy the device. Furthermore, even before the junction has failed, a Schottky diode may experience large reverse leakage currents. In order to reduce such leakage currents, the junction barrier Schottky (JBS) diode was developed. JBS diodes are sometimes referred to as Merged PIN-Schottky (MPS) diodes. A conventional JBS diode 10 is illustrated in FIG. 1. As shown therein, a conventional JBS diode includes an n-type substrate 12 on which an n− drift layer 14 is formed. A plurality of p+ regions 16 are formed, typically by ion implantation, in the surface of the n− drift layer 14. A metal anode contact 18 is formed on the surface of the n− drift layer 14 in contact with both the n− drift layer 14 and the p+ regions 16. The anode contact 18 forms a Schottky junction with the exposed portions of the drift layer 14, and may form an ohmic contact with the p+ regions 16. A cathode contact 20 is formed on the substrate 12. Silicon carbide-based JBS diodes are described, for example, in U.S. Pat. Nos. 6,104,043 and 6,524,900.

In forward operation, the junction J1 between the anode contact 18 and the drift layer 14 turns on before the junction 2 between the p+ regions 16 and the drift layer 14. Thus, at low forward voltages, the device exhibits Schottky diode behavior. That is, current transport in the device is dominated by majority carriers (electrons) injected across the Schottky junction J1 at low forward voltages. As there may be no minority carrier injection (and thus no minority charge storage) in the device at normal operating voltages, JBS diodes have fast switching speeds characteristic of Schottky diodes.

Under reverse bias conditions, however, the depletion regions formed by the PN junctions J2 between the p+ regions 16 and the drift layer 14 expand to block reverse current through the device 10, protecting the Schottky junction J1 and limiting reverse leakage current in the device 10. Thus, in reverse bias, the JBS diode 10 behaves like a PIN diode. The voltage blocking ability of the device 10 is typically determined by the thickness and doping of the drift layer 14 and the design of the edge termination.

One problem commonly encountered with silicon carbide JBS diodes is their ability to handle current surges. Silicon carbide JBS Schottky diodes are typically designed for use in power switching applications, such as power factor control (PFC) in high voltage distribution systems. In such applications, surge currents can be experienced during power on and/or after line cycle dropouts. When a current surge occurs, substantial power can be dissipated in the diode, which can result in catastrophic failure of the device due to thermal runaway.

A JBS Schottky diode can be designed so that the the junction J2 between the p+ regions 16 and the drift layer 14 turns on under high current conditions, resulting in an injection of minority carriers (holes) across the junction J2 into the drift layer 14. This injection of minority carriers modulates the conductivity of the drift layer 14, reducing the resistance to current and therefore reducing the potential for failure of the device as a result of the current surge. However, designing the p+ regions 16 so that the junction J2 turns on at high currents can undesirably increase the on-state resistance of the device at lower currents.

SUMMARY

An electronic device according to some embodiments includes a silicon carbide drift region having a first conductivity type, a Schottky contact on the drift region, and a plurality of junction barrier Schottky (JBS) regions at a surface of the drift region adjacent the Schottky contact. The JBS regions have a second conductivity type opposite the first conductivity type and have a first width and a first spacing between adjacent ones of the JBS regions. The device further includes a surge protection region at the surface of the drift region adjacent the Schottky contact. The surge protection region has a second width greater than the first width and includes a plurality of surge protection subregions having the second conductivity type. Each of the surge protection subregions has a third width less than the first width and has a second spacing between adjacent ones of the surge protection subregions that may be less than the first spacing between adjacent ones of the JBS regions.

The first spacing may be about 4 μm to about 6 μm and the second spacing may be about 1 μm to about 3 μm. The first width may be about 1 μm to about 3 μm and the third width may be about 1 μm to about 3 μm.

The surge protection subregions may extend into the drift layer from the surface of the drift layer by a depth of about 0.3 μm to about 0.5 μm. A doping level of the drift region may be about $5 \times 10^{14}$ cm$^{-3}$ to about $1 \times 10^{16}$ cm$^{-3}$.

The first spacing, the second spacing and the third width are configured such that a voltage drop from a surface of the drift layer to a center of a junction between one of the surge protection subregions and the drift region may be sufficient to cause the junction to become forward biased at a forward current that is higher than a rated current of the Schottky diode so as to provide a current surge handling ability in the Schottky diode.

An interface between the Schottky contact and the surge protection subregions may be an ohmic contact.

The drift layer may include 4H—SiC. The drift layer may have a doping level of about $5 \times 10^{15}$ cm$^{-3}$ to $1 \times 10^{16}$ cm$^{-3}$, and the current surge control subregions may have a doping level greater than $5 \times 10^{18}$ cm$^{-3}$.

A portion of the drift region beneath the surge protection regions may have a higher electric potential than a portion of the drift region beneath the JBS regions in response to a forward voltage applied to the Schottky contact.

The device may further include a plurality of current surge control regions in the drift layer adjacent the Schottky contact.

The first conductivity type may include n-type and the second conductivity type may include p-type.

The surge control subregions include a plurality of trenches in the drift region and a plurality of doped regions in the drift layer extending beneath respective ones of the plurality of trenches.

The surge protection subregions may define vertical current paths in the drift region between respective ones of the surge protection subregions, a depth of the surge protection regions may be defined by a depth of the trenches and a depth of the doped regions.

Methods of forming a Schottky diode according to some embodiments include forming a plurality of junction barrier Schottky (JBS) regions at a surface of a silicon carbide drift region having a first conductivity type, the plurality of JBS regions having a second conductivity type opposite the first conductivity type and having a first spacing between adjacent ones of the JBS regions. The methods further include forming a surge protection region at the surface of the drift region adjacent the Schottky contact, the surge protection region including a plurality of surge protection subregions having the second conductivity type and each of the surge protection subregions having a second spacing between adjacent ones of the surge protection subregions that may be less than the first spacing between adjacent ones of the JBS regions. A Schottky contact is formed on the drift region.

The first spacing may be about 4 μm to about 6 μm and the second spacing may be about 1 μm to about 3 μm.

Forming the plurality of JBS regions and forming the surge protection region may include selectively implanting dopant ions of the second conductivity into the drift layer, and annealing the implanted ions at a temperature greater than 1700° C.

The methods may further include forming a graphite coating on the drift layer including the implanted ions, annealing the implanted ions may include annealing the graphite coating.

The methods may further include etching a plurality of trenches in the drift layer before implanting the ions, implanting the ions may include implanting the ions into the plurality of trenches.

Forming the Schottky contact on the drift region may include forming the Schottky contact to the drift region and an ohmic contact to the surge protection subregions using a single metal.

An electronic device according to further embodiments includes a silicon carbide drift region having a first conductivity type, a Schottky contact on the drift region, and a plurality of junction barrier Schottky (JBS) regions at a surface of the drift region adjacent the Schottky contact. The plurality of JBS regions have a second conductivity type opposite the first conductivity type and have a first spacing between adjacent ones of the JBS regions. The device further includes a plurality of surge protection subregions having the second conductivity type. Each of the surge protection subregions has a second spacing between adjacent ones of the surge protection subregions that is less than the first spacing.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
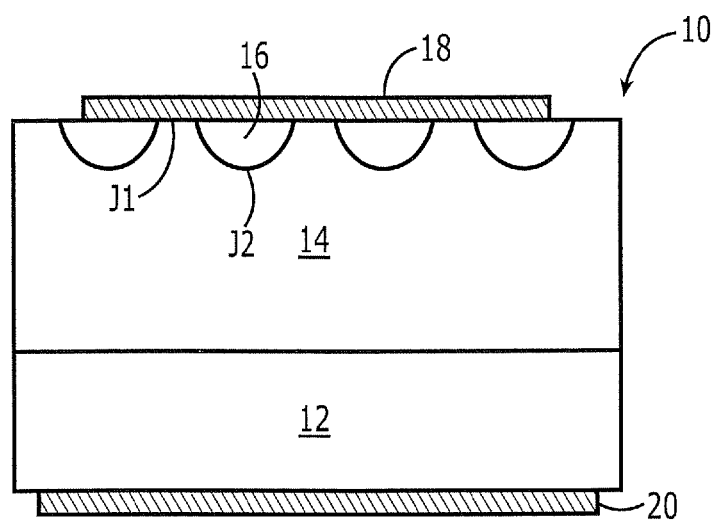
FIG. 1 is a cross-sectional view of a conventional JBS diode.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Figure 2:
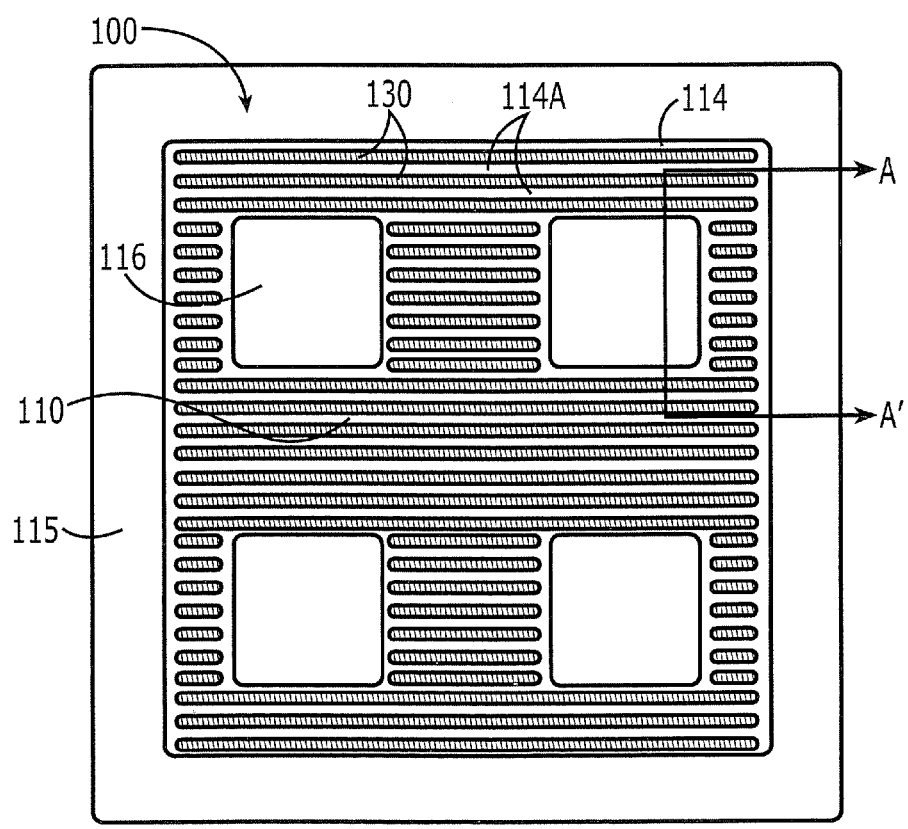
FIG. 2 is a top view of a JBS diode including surge protection regions.

FIG. 2 is a top view of a Schottky diode structure 100 in which current surges are handled by sizing and doping the p+ regions so that they will turn on at high current densities and inject minority carriers into the drift layer 14. Similar diodes are disclosed in U.S. Publication No. 2008/0029838 entitled "Semiconductor Devices Including Schottky Diodes With Controlled Breakdown And Methods Of Fabricating Same", which is assigned to the assignee of the present invention, the disclosure of which is incorporated herein by reference.

Referring to FIG. 2, the diode 100 includes a drift layer 114 having an upper surface in which a plurality of JBS regions 130 of opposite conductivity type from the drift layer 114 are formed as stripe-shaped regions in the drift layer 114. The JBS regions 130 may be formed, for example, by ion implantation of p-type dopants such as boron and/or aluminum into the drift layer 114 at a concentration of about $1 \times 10^{17}$ to about $1 \times 10^{18}$ cm$^{-3}$, and may extend to a depth of about 0.3 to about 0.5 µm beneath the surface of the drift layer 114.

One or more surge protection regions 116 is also provided in the drift layer 114. The surge protection regions 116 may be formed, for example, by ion implantation of p-type dopants such as boron and/or aluminum into the drift layer 114 at a concentration of about $1 \times 10^{18}$ to about $1 \times 10^{19}$ cm$^{-3}$, and may extend to a depth of about 0.3 to about 0.5 µm beneath the surface of the drift layer 114.

The JBS regions 130 expose portions 14A of the surface of the drift layer 114 and that extend across an active region 110 of the drift layer 114 (except for the exposed portions 114A of the drift layer and the heavily doped regions 116). A metal Schottky contact 118 (FIG. 3) covers the drift layer 114 and is in contact with the exposed portions 114A of the drift layer 114 as well as the JBS regions 130 and the surge protection regions 116. As used herein, the term "active region" refers to the two dimensional area of the device in which the Schottky metal contacts the drift layer and includes the exposed portions 114A of the drift layer 114, the JBS regions 130 and the surge protection regions 116. Accordingly, the active region includes the Schottky junction area but does not include, for example, the edge termination region.

Figure 3:
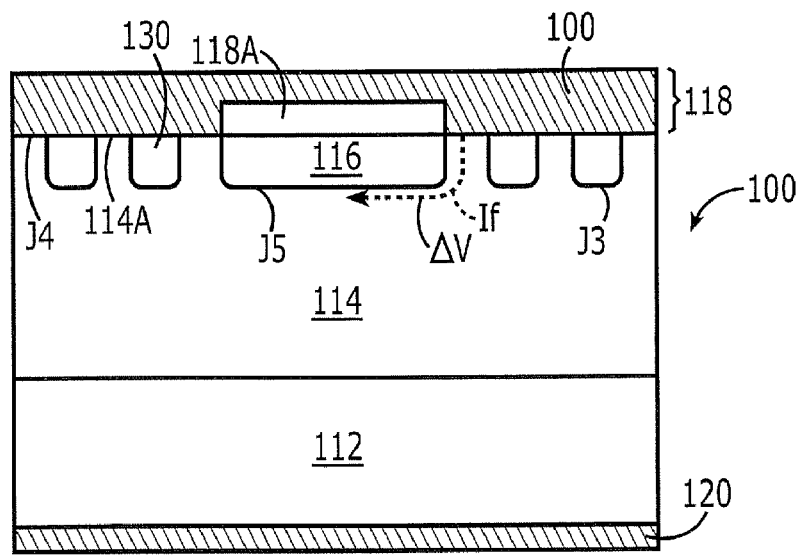
FIG. 3 is a cross-sectional view of a JBS diode including a surge protection region.

FIG. 3 is a cross-sectional illustration of the diode 100 taken generally along lines A-A' of FIG. 2. As seen in FIG. 3, the diode 100 includes a substrate 112 on which the drift layer 114 is formed. The surge protection regions 116 may be formed as an implanted region within the drift layer 114. Similarly, the JBS regions 130 may be formed as implanted regions in the drift layer 114. As the surge protection regions 116 and the JBS regions 130 have an opposite conductivity type from the drift layer 114, the JBS regions 130 form a p-n junction J3 with the drift layer 114, while the heavily doped regions 116 form a p-n junction J5 with the drift layer 114.

An anode contact 118 on the surface of the drift layer 114 forms a Schottky junction J4 with the exposed portions 114A of the drift layer 114 between adjacent lightly doped regions 130 and/or between a JBS region 130 and the surge protection region 116. The anode contact 118 may include a metal, such as aluminum, titanium and/or nickel, that may form an ohmic contact with the surge protection region 116, while forming a Schottky contact with the drift layer 114. As illustrated in FIG. 3, the anode contact 118 can include a first portion 118A that forms an ohmic contact on the surge protection region 116 and a second portion 118B that forms a Schottky contact with the drift layer 114. In particular, the second portion 118B may be formed to cover the first portion 118A of the anode contact 118. The first portion 118A may include, for example, aluminum, titanium and/or nickel, while the second portion 118B may include, for example, aluminum, titanium and/or nickel.

A cathode contact 120 is formed on a side of the substrate 112 opposite the drift layer 114. The cathode contact 120 may include a metal, such as nickel, that is capable of forming an ohmic contact to n-type silicon carbide.

In forward operation, the junction J4 between the anode contact 118 and the exposed portions 114A of the drift layer 114 turns on before the junction J5 between the surge protection region 116 and the drift layer 114. Thus, at low forward voltages, the device exhibits Schottky diode behavior. That is, at low forward voltages, the operation of the diode 100 is dominated by the injection of majority carriers across the Schottky junction J4. Due to the absence of minority carrier injection under normal operating conditions, the diode 100 may have a very fast switching capability, which is characteristic of Schottky diodes in general.

The surge protection region 116 may be designed to begin to conduct at a forward voltage that is higher than the turn-on voltage of the Schottky junction J4. Thus, in the event of a current surge that causes the forward voltage of the diode 100 to increase, the p-n junction J5 will begin to conduct. Once the p-n junction J5 begins to conduct, the operation of the diode 100 becomes dominated by the injection and recombination of minority carriers across the p-n junction J5. In that case, the on-state resistance of the diode may decrease, which may decrease the amount of power dissipated by the diode 100 for a given level of current. Thus, turn-on of the p-n junction J5 when the forward voltage of the diode 100 increases may reduce and/or prevent forward current runaway in the diode 100.

In forward operation, a forward current If flows vertically downward adjacent the JBS regions 130 and the surge protection region 116. Current also flows horizontally across the face of the surge protection region 116. Turn-on of the p-n junction J5 occurs when a voltage drop ΔV from the surface 114A of the drift region to the middle of the surge protection region 116 exceeds the built-in voltage of the p-n junction J5. Thus, for a given level of doping in the drift region 114, the surge protection region 116 may be designed to have at least a minimum lateral width (or minimum extent) to cause the p-n junction J5 to turn on at a desired turn-on level of the forward current If.

Some embodiments of the invention arise from a realization that the desired voltage drop can be obtained by methods other than simply increasing the lateral width of the surge protection region 116, which can undesirably increase the on-state resistance of the device 100.

Figure 4:
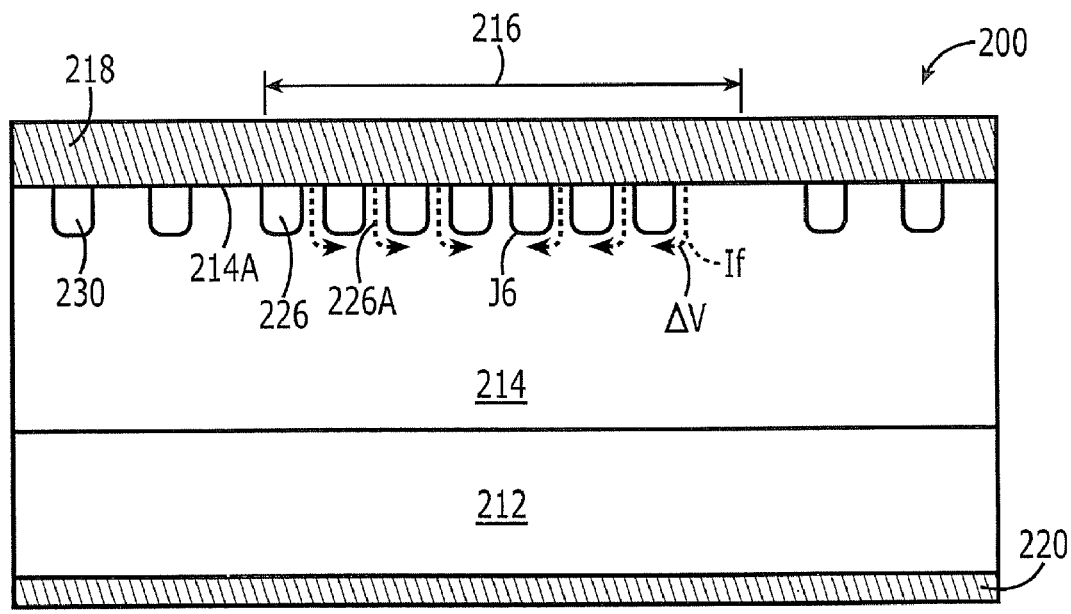
FIG. 4 is a cross-sectional view of a JBS diode according to some embodiments.

For example, FIG. 4 illustrates embodiments in which a surge protection region 216 is formed using a plurality of subregions 226 having a defined depth, width, spacing and doping to provide both reverse bias protection as well as surge current protection.

In particular, FIG. 4 is a cross-sectional view of a diode 200 according to some embodiments of the invention. The diode 200 includes a drift layer 214 having an upper surface in which a plurality of JBS regions 230 of opposite conductivity type from the drift layer 214 are formed.

The drift layer 214 may be formed, for example, from n-type silicon carbide of the 2H, 4H, 6H, 3C and/or 15R polytype having a dopant concentration of about $5\times10^{14}$ to about $1\times10^{16}$ cm$^{-3}$, depending on design requirements for voltage blocking and on-resistance for the diode 200. Other types of semiconductor materials, such as GaN, GaAs, silicon or germanium may be used. In particular embodiments, the drift layer 214 includes 4H—SiC doped with n-type dopants at a concentration of about $5\times10^{15}$ cm$^{-3}$. The JBS regions 230 may be formed, for example, by ion implantation of p-type dopants such as boron and/or aluminum into the drift layer 214 at a concentration of about $1\times10^{18}$ cm$^{-3}$ to $1\times10^{19}$ cm$^{-3}$, and may extend to a depth of about 0.3 to about 0.5 μm beneath the surface of the drift layer 214. In particular embodiments, the JBS regions 230 may be doped with p-type dopants at a concentration of about $5\times10^{18}$ cm$^{-3}$.

The surge protection region 216 includes a plurality of subregions 226 in the drift layer 214. The subregions 226 may be formed, for example, by ion implantation of p-type dopants such as boron and/or aluminum into the drift layer 214 at a concentration of about $1\times10^{18}$ to about $1\times10^{19}$ cm$^{-3}$, and may extend to a depth of about 0.3 to about 0.5 μm beneath the surface of the drift layer 114. In particular embodiments, the subregions 116 may be doped at a dopant concentration of about $5\times10^{18}$ cm$^{-3}$, and may extend to a depth of about 0.5 μm beneath the surface of the drift layer 214. Each of the subregions 226 forms a p-n junction J6 with the drift region 214. In some embodiments, the subregions 226 can be implanted at the same time as the JBS regions 230. Accordingly, the subregions 226 can have the same depth and doping profile as the JBS regions 230. However, in other embodiments, the subregions 226 can be formed in a different process than the JBS regions 230 and can have a different depth and/or doping profile than the JBS regions 230.

Activation of the implanted dopants in the JBS regions 230 and the subregions 226 can be performed by annealing the structure including the substrate 212, the drift layer 214 and the implanted regions at a sufficiently high temperature. In some embodiments, a graphite coating may be formed on the surface of the drift region 214 prior to implant activation. The graphite coating may be removed after annealing the implanted ions. The graphite coating may be crystallized before annealing the implanted ions.

The implanted ions may be annealed at a temperature greater than 1700° C., and in some embodiments greater than 1800° C.

Figure 6:
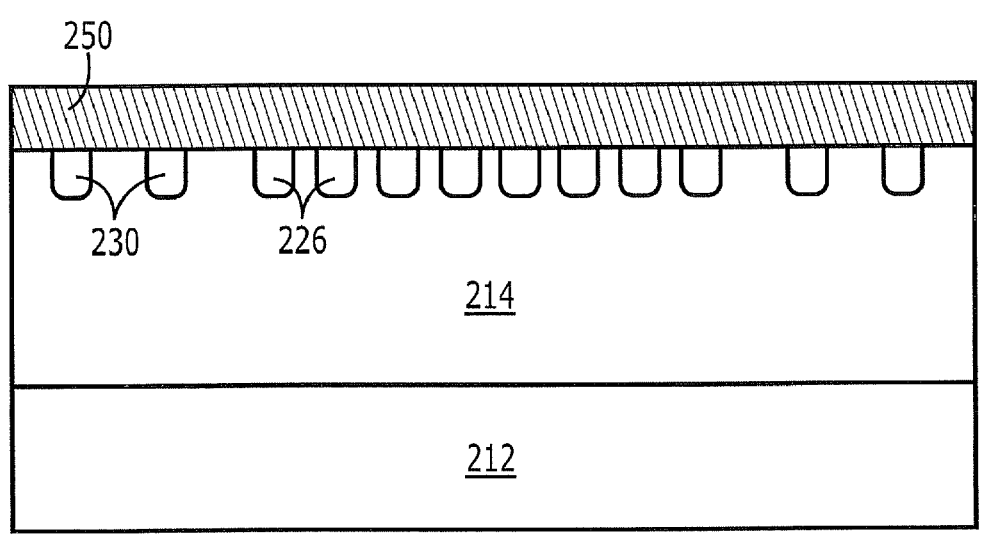
FIG. 6 is a cross-sectional view of an intermediate structure formed during fabrication of a JBS diode according to some embodiments.

For example, referring to FIG. 6, the implanted dopants in the JBS regions 230 and the subregions 226 may be activated by annealing the structure at a temperature of about 1600° C. or more with a silicon over pressure and/or covered by an encapsulation layer such as a graphite film. In some embodiments, the implants may be activated by annealing at a temperature greater than about 1700° C. using a graphite coating.

A high temperature activation anneal (e.g. 1700° C. or more) may enhance the activation of the threshold adjustment ions, as well as annealing of defects in the channel region 40. However, such a high temperature anneal may damage the surface of the silicon carbide drift layer 16.

To reduce damage that may result from a high temperature anneal, a graphite coating 250 may be formed on the surface of the structure prior to formation of the metal contacts thereto. That is, prior to annealing the structure to activate the implanted ions, a graphite coating 250 may be applied to the top/front side of the drift layer 214 in order to protect the surface of the structure during the anneal. The graphite coating 250 may be applied by a conventional resist coating method and may have a thickness that is sufficient to protect the underlying SiC layers during a high temperature anneal. The graphite coating 250 may have a thickness of about 1 μm. Prior to the anneal, the graphite coating 250 may be heated to form a crystalline coating on the drift layer 214. The implanted ions may be activated by a thermal anneal that may be performed, for example, in an inert gas at a temperature of about 1700° C. or greater. In particular the thermal anneal may be performed at a temperature of about 1850° C. in argon for 5 minutes. The graphite coating 250 may help to protect the surface of the drift layer 214 during the high temperature anneal.

The graphite coating 250 may then be removed, for example, by ashing and thermal oxidation.

In addition to activating the implanted ions, a high temperature anneal with a graphite coating can facilitate the formation of an ohmic contact to the subregions 216. That is, without wishing to be bound by any particular theory of operation, it is presently believed that p-type dopants, such as Al ions, in the surge protection subregions 226 accumulate at the surface of the subregions 226 during a high temperature anneal. When a metal, such as titanium, is deposited onto the drift layer 214 as the anode contact 218, the metal may desirably form an ohmic contact with the underlying subregions 226. Forming an ohmic contact between the anode metal 218 and the subregions 226 may enhance the overcurrent protection provided by the surge protection region 216 by making it easier for the p-n junction J6 to turn on at the desired level of forward current. Furthermore, in some embodiments, it may be possible to use only a single metal for the anode contact that forms a Schottky contact to the drift region 214 as well as an ohmic contact to the subregions 226, which can reduce manufacturing time and/or expense.

The JBS regions 230 shown in the embodiments of FIG. 4 may be provided as spaced apart striped regions that expose portions 214A of the surface of the drift layer 214 and that extend across an active region of the drift layer 214 (except for the exposed portions 214A of the drift layer and the subregions 226). A metal Schottky contact 218 covers the drift layer 214 and is in contact with the exposed portions 214A of the drift layer 214 as well as the JBS regions 230 and the subregions 226.

The diode 200 may include an edge termination region (not shown) surrounding the active region 110 of the diode 100. The edge termination region may include a junction termination extension (JTE) region, field rings, field plates, guard rings, and/or a combination of the foregoing or other terminations.

A cathode contact 220 is formed on a side of the substrate 212 opposite the drift layer 214. The cathode contact 220 may include a metal, such as nickel, that is capable of forming an ohmic contact to n-type silicon carbide.

In forward operation, a forward current If flows vertically downward adjacent the JBS regions 230 and the subregions 226. Current also flows horizontally across the face of the surge protection regions 226. Turn-on of the p-n junction J6 between a subregion 226 and the drift layer 214 occurs when a voltage drop ΔV from the surface 214A of the drift region to the middle of the subregion 226 exceeds the built-in voltage of the p-n junction J6. However, a portion of the voltage drop ΔV can occur in the vertical current path 226A between adjacent subregions 226. The resistance of a vertical current path 226A is a function of the length and width of the vertical current path 226A and the surface doping of the drift region 214. Accordingly, some embodiments control the length and width of the vertical current path 226A as well as the surface doping of the drift region 214 so that bipolar conduction between the subregions 226 and the drift region 214 across the junction J6 occurs at a desired level of forward current.

Figure 5:
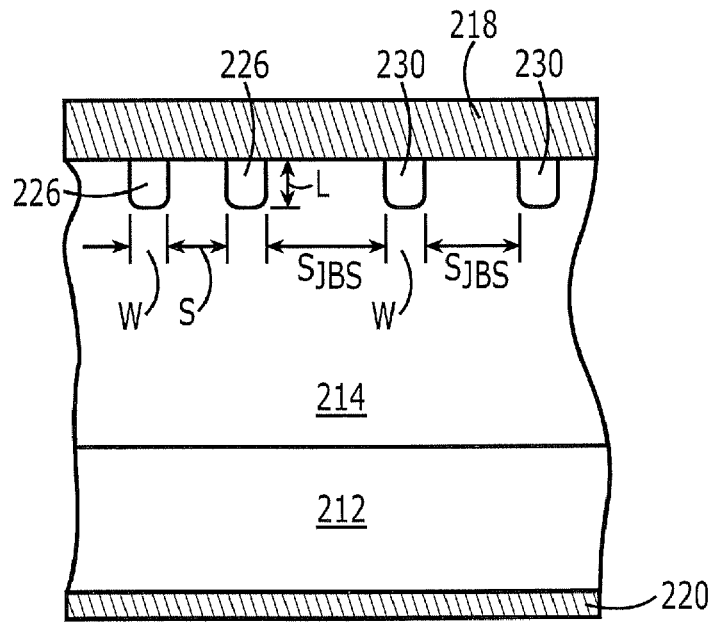
FIG. 5 is a detail view illustrating additional aspects of the JBS diode of FIG. 4.

Some further aspects of the diode 200 are shown in FIG. 5, which is a cross-sectional detail view of portions of the diode 200. In particular, as illustrated in FIG. 5, the subregions 226 may have a width W, a spacing S and a depth L. The JBS regions 230 may have a width $W_{JBS}$ and a spacing $S_{JBS}$. The JBS regions 230 may be spaced apart from the surge protection region 216 by the JBS spacing $S_{JBS}$. The resistance of the vertical current paths 226A between adjacent subregions 226 can be expressed as:

$$R = \rho \frac{L}{S} \quad (1)$$

That is, the resistance of the vertical current paths is proportional to the depth L of the subregions 226 and is inversely proportional to the spacing S between adjacent subregions 226. Accordingly, a desired voltage drop ΔV can be obtained by making the subregions 226 deeper and/or more closely spaced. Making the subregions 226 deeper may present a challenge due to the limits of ion implantation technology. In particular, using ion implantation alone, it may be difficult to form the subregions 226 to have a depth L of more than 0.5 μm. This limitation is addressed in further embodiments, described in detail below.

However, the spacing S between adjacent subregions 226 can be reduced through photolithography so that the resistance of the vertical current paths 226A can be increased to the point that conduction of the p-n junction J6 can begin at a desired level of forward current If.

In some embodiments, the depth L of the subregions 226 may be from 0.3 to 0.5 μm. The width W of the subregions 226 may be from about 1 μm to about 3 μm. The spacing S between adjacent subregions 226 may be from about 1 μm to about 3 μm. The width $W_{JBS}$ of the JBS regions 230 may be from about 1 μm to about 3 μm. The spacing $S_{JBS}$ between adjacent JBS regions 230 and/or between a JBS region 230 and the current surge region 216 may be from about 4 μm to about 6 μm, or about 2 to 4 times the spacing S between adjacent subregions 226. The width of the surge protection region 216 may be about 10 μm or more.

Figure 7A:
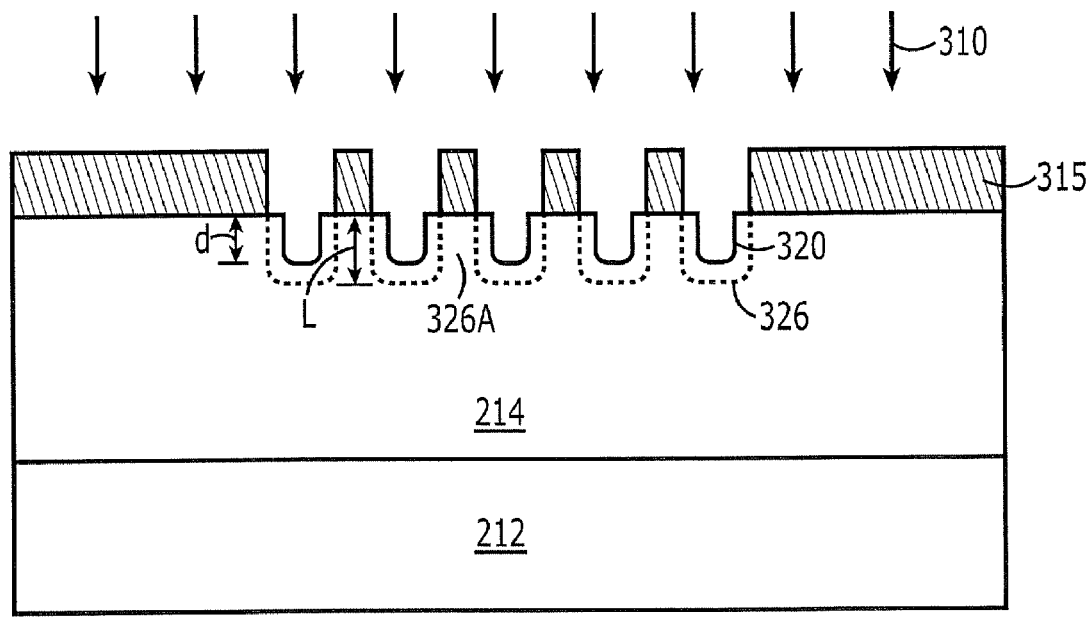
FIG. 7A is a cross-sectional view of an intermediate structure formed during fabrication of a JBS diode according to further embodiments.
Figure 7B:
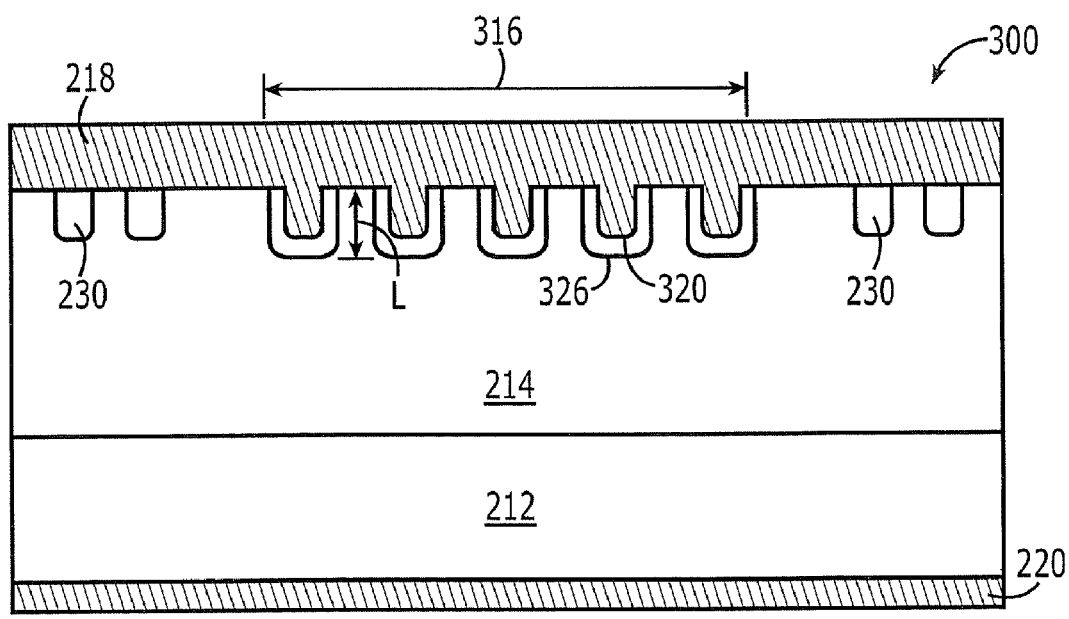
FIG. 7B is a cross-sectional view of a JBS diode according to further embodiments.

FIGS. 7A and 7B illustrate structures/methods according to further embodiments. As shown therein, subregions 326 of a surge protection region 316 can be formed by etching trenches 320 into the drift layer 214. The subregions 326 can be etched, for example, using a dry etch technique such as plasma etching, Inductively Coupled Plasma (ICP), Electron Cyclotron Resonance (ECR), etc., using a fluroine based chemistry such as $SF_6$, $CHF_3$, etc.

The trenches 320 can be etched to a depth d of from about 0.3 μm to about 1 μm. After trench formation, ions 310, for example, p-type ions such as aluminum and/or boron, can be implanted into the trenches 320 through an implant mask 315 to form the subregions 326. The ions can be implanted, for example, at a dose of $1 \times 10^{15}$ cm$^2$, and an energy of up to 300 keV. The ions can be implanted with a tilt angle of 30° so that the sidewalls of the trenches 320 are implanted. Furthermore, the implantation can be performed at a temperature of 25° C. As will be appreciated, the depth L of the vertical channel 326A between adjacent subregions 326 is then the sum of the depth d of the trenches 320 and the junction depth of the implants. A longer vertical channel 326A with a correspondingly higher resistance can thereby be obtained.

Furthermore, the anode contact 218 can penetrate into the trenches 320 to form ohmic contacts to the subregions 326 with a larger surface area, and hence lower resistance. The resulting device 300, including an anode contact 220 on the substrate 212, is shown in FIG. 7B.

Figure 8A:
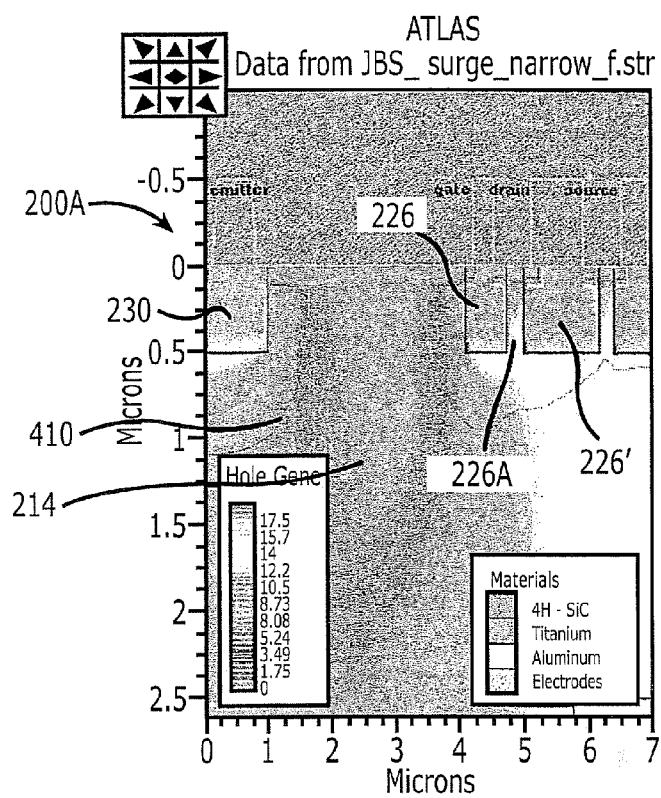
FIG. 8A illustrates a simulated device structure and simulation results for a device according to some embodiments.
Figure 8B:
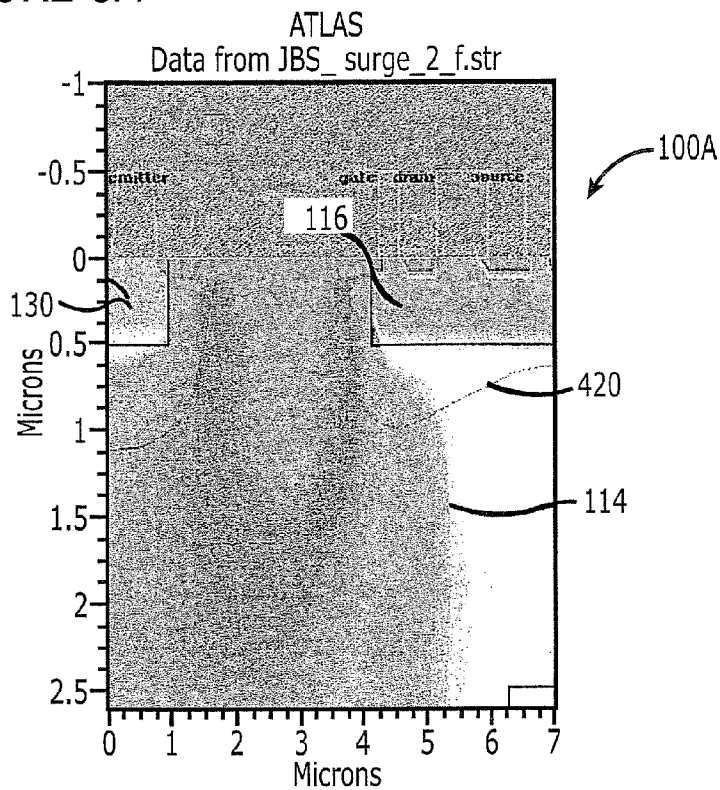
FIG. 8B illustrates a simulated device structure and simulation results for a comparison device.

FIGS. 8A and 8B illustrate simulation results for diodes similar to the diodes illustrated in FIGS. 4 and 3, respectively. In particular, FIGS. 8A and 8B graphically illustrate hole concentrations in the devices under surge current conditions at a forward voltage drop of 5.2V. For example, FIG. 8A illustrates a structure 200A including a drift region 214. A JBS region 230 and a plurality of surge protection subregions 226 are formed at a surface of the drift region 214. Vertical current paths 226A are defined between adjacent ones of the surge protection subregions 226. Also plotted in FIG. 8A is a line 410 that indicates the position of the depletion region boundary within the structure 200A. FIG. 8B illustrates a structure 100A including a drift region 114. A JBS region 130 and a single surge protection region 116 are formed at a surface of the drift region 114. The line 420 in FIG. 8B indicates the position of the depletion region boundary in the structure 100A.

As shown in FIGS. 8A and 8B, holes can be injected from the subregions 226 in the device 200A of FIG. 8A and from the surge protection region 116 in the device 100A of FIG. 8B. However, a higher hole concentration can be injected from the central subregion 226' in the device 200A in FIG. 8A than from the surge protection region 116 in the device 100A in FIG. 8B.

Figure 9:
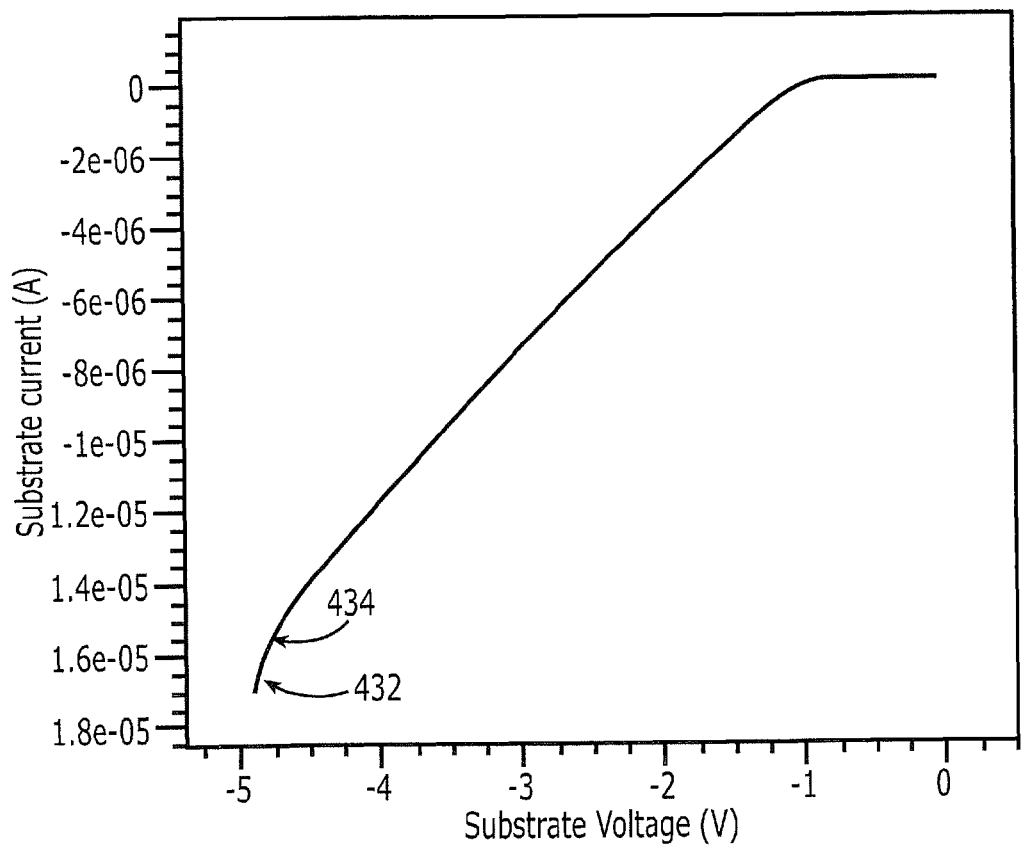
FIG. 9 illustrates simulated current versus voltage characteristics for a device according to some embodiments.

FIG. 9 illustrates simulated current versus voltage for the structures 200A and 100A shown in FIGS. 8A and 8B, respectively. In particular, FIG. 9 indicates that a current begins in both devices at a voltage of approximately 4.8V. However, the device 200A appears to have a lower resistance during surge current conditions than the device 100A, as indicated by a higher slope of the I-V curve at voltages exceeding 4.8V. It will be appreciated that in the simulation, the voltage was referenced from the cathode to the anode. Thus, forward bias and forward current were assigned negative polarities.

Figure 10:
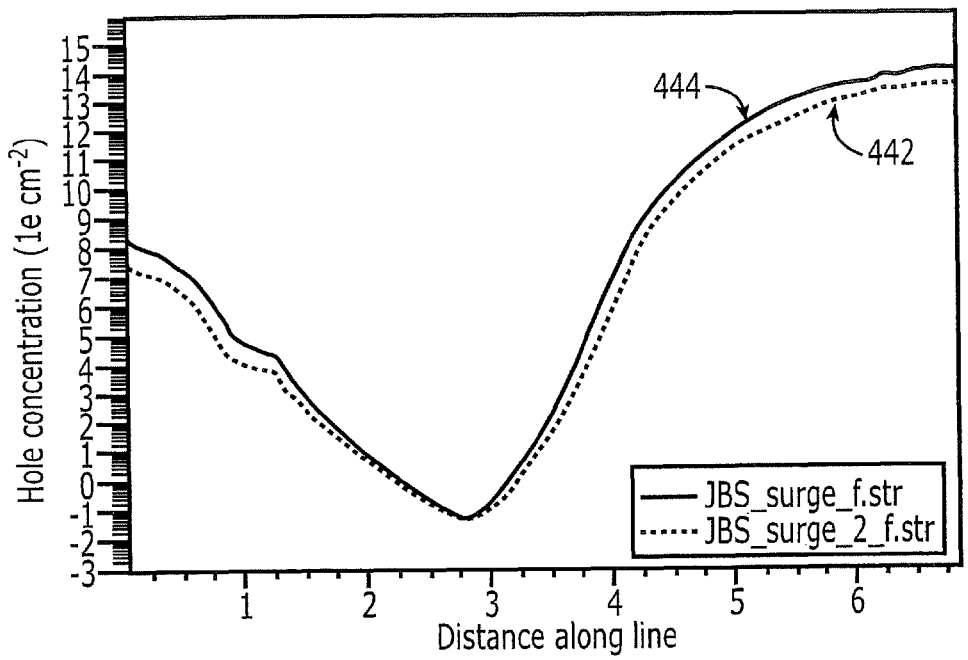
FIG. 10 illustrates simulated hole concentration characteristics for a device according to some embodiments.

FIG. 10 is a graph of simulated hole concentration versus lateral position in the devices 200A and 100A illustrated in FIGS. 8A and 8B, respectively. In particular, curve 442 shows the simulated hole concentration versus position for the device structure 100A of FIG. 8B, while curve 444 shows the simulated hole concentration versus position for the device structure 200A of FIG. 8A. The simulations predict higher hole concentrations for the device structure 200A of FIG. 8A.

Figure 11:
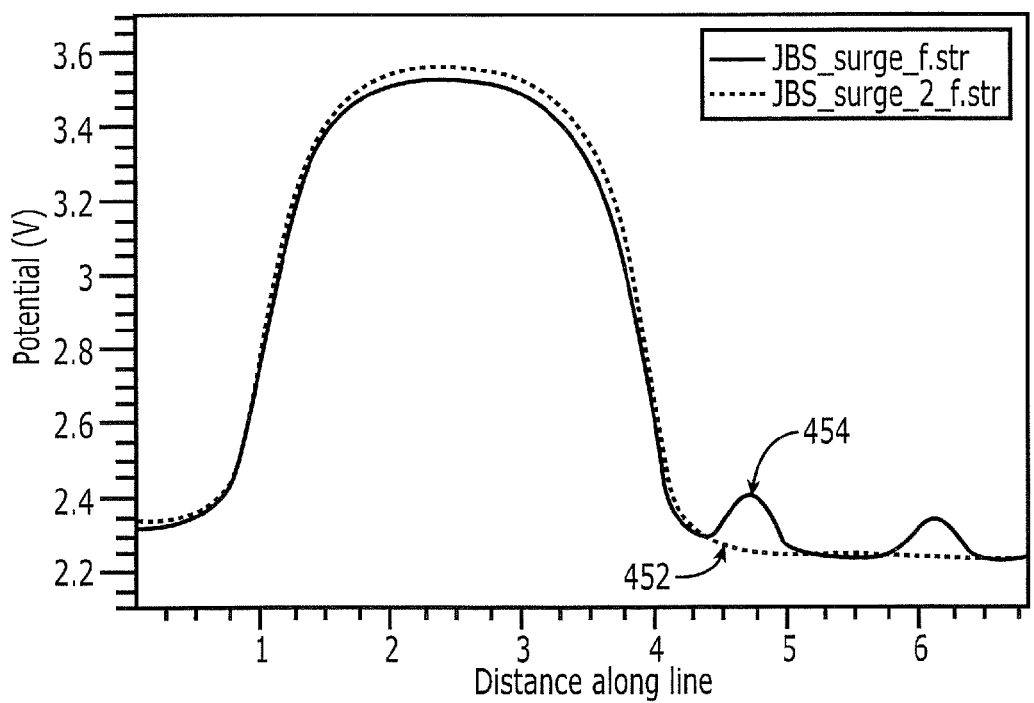
FIG. 11 illustrates simulated voltage potential characteristics for a device according to some embodiments.
Figure 12:
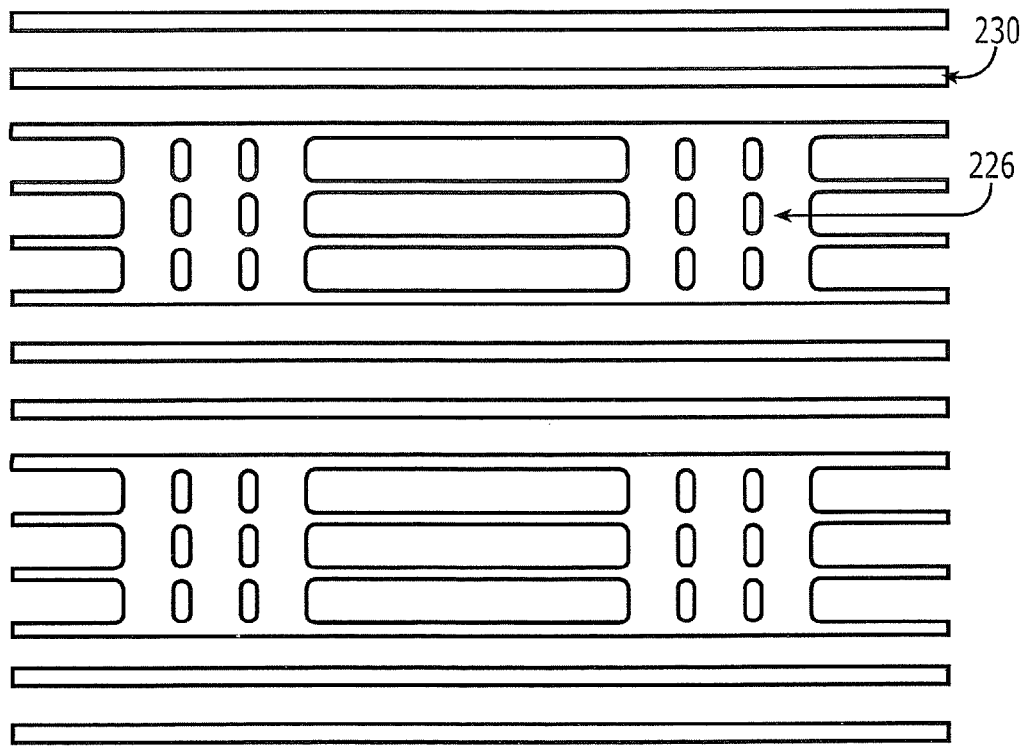
FIG. 12 illustrates an implantation mask pattern that can be used according to some embodiments.

FIG. 11 is a graph of simulated potential versus lateral position in the devices 200A and 100A illustrated in FIGS. 8A and 8B, respectively. In particular, curve 452 shows the simulated potential versus position for the device structure 100A of FIG. 8B, while curve 454 shows the simulated potential versus position for the device structure 200A of FIG. 8A. The simulations predict local increases in potential over the vertical current paths 226A between adjacent subregions 226 for the device structure 200A of FIG. 8A. Furthermore, in the device structure 200A, a portion of the drift region beneath the surge protection subregions 226 has a higher electric potential than a portion of the drift region beneath the JBS regions 230 in response to a forward voltage applied to the Schottky contact FIG. 12 illustrates an exemplary mask layout for the p-type implants that define the JBS regions 230 and the subregions 226 for the device 200 shown in FIG. 4.

While embodiments of the present invention have been described with reference to particular sequences of operations, as will be appreciated by those of skill in the art, certain operations within the sequence may be reordered while still benefiting from the teachings of the present invention. Accordingly, the present invention should not be construed as limited to the exact sequence of operations described herein.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A Schottky diode, comprising:
   a silicon carbide drift region having a first conductivity type;
   a Schottky contact on the drift region;
   a plurality of junction barrier Schottky (JBS) regions at a surface of the drift region adjacent the Schottky contact, the plurality of JBS regions having a second conductivity type opposite the first conductivity type and having a first width and a first spacing between adjacent ones of the JBS regions; and
   a surge protection region at the surface of the drift region adjacent the Schottky contact, the surge protection region having a second width greater than the first width and comprising a plurality of surge protection subregions having the second conductivity type and each of the surge protection subregions having a third width less than the first width and having a second spacing between adjacent ones of the surge protection subregions that is less than the first spacing between adjacent ones of the JBS regions.

2. The Schottky diode of claim 1, wherein the first spacing is about 4 μm to about 6 μm and wherein the second spacing is about 1 μm to about 3 μm.

3. The Schottky diode of claim 1, wherein the first width is about 1 μm to about 0.3 μm and wherein the third width is about 1 μm to about 3 μm.

4. The Schottky diode of claim 1, wherein the surge protection subregions extend into the drift layer from the surface of the drift layer by a depth of about 0.3 μm to about 0.5 μm.

5. The Schottky diode of claim 1, wherein a doping level of the drift region is about $5\times10^{14}$ cm$^{-3}$ to about $1\times10^{16}$ cm$^{-3}$.

6. The Schottky diode of claim 5, wherein the first spacing, the second spacing and the third width are configured such that a voltage drop from a surface of the drift layer to a center of a junction between one of the surge protection subregions and the drift region is sufficient to cause the junction to become forward biased at a forward current that is higher than a rated current of the Schottky diode so as to provide a current surge handling ability in the Schottky diode.

7. The Schottky diode of claim 1, wherein an interface between the Schottky contact and the surge protection subregions is an ohmic contact.

8. The Schottky diode of claim 1, wherein the drift layer comprises 4H—SiC, wherein the drift layer has a doping level of about $5\times10^{15}$ cm$^{-3}$ to $1\times10^{16}$ cm$^{-3}$, and wherein the current surge protection subregions have a doping level greater than $5\times10^{18}$ cm$^{-3}$.

9. The Schottky diode of claim 1, wherein a portion of the drift region beneath the surge protection region has a higher electric potential than a portion of the drift region beneath the JBS regions in response to a forward voltage applied to the Schottky contact.

10. The Schottky diode of claim 1, further comprising a plurality of current surge protection regions in the drift layer adjacent the Schottky contact.

11. The Schottky diode of claim 1, wherein the first conductivity type comprises n-type and the second conductivity type comprises p-type.

12. The Schottky diode of claim 1, wherein the surge protection subregions comprise a plurality of trenches in the drift region and a plurality of doped regions in the drift layer extending beneath respective ones of the plurality of trenches.

13. The Schottky diode of claim 12, wherein the surge protection subregions define vertical current paths in the drift region between respective ones of the surge protection subregions, wherein a depth of the surge protection regions is defined by a depth of the trenches and a depth of the doped regions.

14. A method of forming a Schottky diode, comprising:
providing a plurality of junction barrier Schottky (JBS) regions at a surface of a silicon carbide drift region having a first conductivity type, the plurality of JBS regions having a second conductivity type opposite the first conductivity type and having a first spacing between adjacent ones of the JBS regions;
providing a surge protection region at the surface of the drift region, the surge protection region comprising a plurality of adjacent surge protection subregions that are spaced apart laterally from the JBS regions and that have the second conductivity type, and each of the surge protection subregions having a second spacing between adjacent ones of the surge protection subregions that is less than the first spacing between adjacent ones of the JBS regions, wherein the surge protection region has a width that is greater than the first spacing; and
providing a Schottky contact on the drift region and in contact with the plurality of JBS regions and the plurality of surge protection regions.

15. The method of claim 14, wherein the first spacing is about 4 μm to about 6 μm and wherein the second spacing is about 1 μm to about 3 μm.

16. The method of claim 14, wherein forming the plurality of JBS regions and forming the surge protection region comprises:
selectively implanting dopant ions of the second conductivity into the drift layer; and
annealing the implanted ions at a temperature greater than 1700° C.

17. The method of claim 16, further comprising forming a graphite coating on the drift layer including the implanted ions, wherein annealing the implanted ions comprises annealing the graphite coating.

18. The method of claim 16, further comprising etching a plurality of trenches in the drift layer before implanting the ions, wherein implanting the ions comprises implanting the ions into the plurality of trenches.

19. The method of claim 16, wherein forming the Schottky contact on the drift region comprises forming the Schottky contact to the drift region and an ohmic contact to the surge protection subregions using a single metal.

20. A Schottky diode, comprising:
a silicon carbide drift region having a first conductivity type;
a Schottky contact on the drift region;
a plurality of junction barrier Schottky (JBS) regions at a surface of the drift region adjacent to and in contact with the Schottky contact, the plurality of JBS regions being spaced apart laterally from the JBS regions and having a second conductivity type opposite the first conductivity type and having a first spacing between adjacent ones of the JBS regions; and
a surge protection region including a plurality of surge protection subregions at the surface of the drift region adjacent to and in contact with the Schottky contact, the plurality of surge protection subregions having the second conductivity type and each of the surge protection subregions having a second spacing between adjacent ones of the surge protection subregions that is less than the first spacing, wherein the surge protection region has a width that is greater than the first spacing.

* * * * *